US012071026B2

(12) United States Patent
Yamasaki et al.

(10) Patent No.: US 12,071,026 B2
(45) Date of Patent: Aug. 27, 2024

(54) POWER SOURCE SYSTEM AND MANAGEMENT DEVICE

(71) Applicant: Panasonic Intellectual Property Management Co., Ltd., Osaka (JP)

(72) Inventors: Jun Yamasaki, Hyogo (JP); Changhui Yang, Osaka (JP); Masaharu Amaike, Osaka (JP); Takashi Iida, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 867 days.

(21) Appl. No.: 17/145,302

(22) Filed: Jan. 9, 2021

(65) Prior Publication Data

US 2021/0129683 A1    May 6, 2021

Related U.S. Application Data

(63) Continuation of application No. PCT/JP2019/005067, filed on Feb. 13, 2019.

(30) Foreign Application Priority Data

Jul. 17, 2018 (JP) ................................. 2018-134097

(51) Int. Cl.
*B60L 15/20* (2006.01)
*B60L 3/00* (2019.01)
(Continued)

(52) U.S. Cl.
CPC ......... *B60L 15/2081* (2013.01); *B60L 3/0046* (2013.01); *B60L 15/2045* (2013.01);
(Continued)

(58) Field of Classification Search
CPC ............... B60L 15/2081; B60L 3/0046; B60L 15/2045; B60L 50/50; B60L 15/20;
(Continued)

(56) References Cited

U.S. PATENT DOCUMENTS

| 2010/0019726 A1* | 1/2010 | Kumar | .................... B60L 58/14 320/136 |
| 2016/0075322 A1* | 3/2016 | Saito | ............... B60W 30/18036 903/910 |

(Continued)

FOREIGN PATENT DOCUMENTS

JP    11-205914    7/1999

OTHER PUBLICATIONS

International Search Report of PCT application No. PCT/JP2019/005067 dated May 7, 2019.

*Primary Examiner* — Ian Jen
*Assistant Examiner* — Hossam M Abd El Latif
(74) *Attorney, Agent, or Firm* — Rimon P.C.

(57) ABSTRACT

Controller determines an output limit value that defines an upper limit of a current or power recommended for suppressing cell deterioration based on a voltage, a current, and a temperature of each cell, and notifies host controller in electric vehicle of the determined output limit value. When electric vehicle climbs a hill, controller calculates a current value or power value to be discharged from power storage unit, the current value or power value being required for electric vehicle to climb the hill at a speed not less than a set minimum speed, while suppressing an amount of deterioration of cells within an allowable range, and when the calculated current value or power value is larger than the output limit value, replaces the output limit value with the calculated current value or power value.

18 Claims, 5 Drawing Sheets

(51) Int. Cl.
    *B60L 50/50*     (2019.01)
    *B60L 58/12*     (2019.01)
    *G01R 31/36*     (2020.01)
    *G01R 31/374*     (2019.01)
    *G01R 31/3842*     (2019.01)
    *G01R 31/392*     (2019.01)
    *H01M 10/42*     (2006.01)
    *H01M 10/44*     (2006.01)
    *H01M 10/48*     (2006.01)
    *H02J 7/00*     (2006.01)

(52) U.S. Cl.
    CPC .......... *B60L 50/50* (2019.02); *G01R 31/3842* (2019.01); *G01R 31/392* (2019.01); *H01M 10/425* (2013.01); *H01M 10/48* (2013.01); *H01M 10/482* (2013.01); *H01M 10/486* (2013.01); *H02J 7/0063* (2013.01); *B60L 2240/549* (2013.01); *B60L 2240/642* (2013.01); *H01M 2010/4271* (2013.01)

(58) Field of Classification Search
    CPC ......... B60L 2240/549; B60L 2240/642; B60L 58/12; B60L 2240/545; B60L 2240/547; G01R 31/3842; G01R 31/392; G01R 31/3647; G01R 31/374; H01M 10/425; H01M 10/48; H01M 10/482; H01M 10/486; H01M 2010/4271; H01M 10/441; H01M 2220/20; H02J 7/0063; H02J 7/0047; H02J 2310/48; Y04S 30/12; Y02T 10/64; Y02T 90/167; Y02T 10/7072; Y02T 10/72; Y02T 90/14
    USPC .......................................................... 701/22
    See application file for complete search history.

(56) References Cited

U.S. PATENT DOCUMENTS

| | | | | |
|---|---|---|---|---|
| 2016/0243947 | A1* | 8/2016 | Perkins | B60L 53/14 |
| 2017/0182998 | A1* | 6/2017 | Hatsuda | B60W 20/14 |
| 2018/0198175 | A1* | 7/2018 | Yamauchi | G01R 31/367 |

* cited by examiner

POWER SOURCE SYSTEM AND MANAGEMENT DEVICE

CROSS-REFERENCE TO RELATED APPLICATIONS

This application is a continuation of the PCT International Application No. PCT/JP2019/005067 filed on Feb. 13, 2019, which claims the benefit of foreign priority of Japanese patent application No. 2018-134097 filed on Jul. 17, 2018, the contents all of which are incorporated herein by reference.

TECHNICAL FIELD

The present invention relates to a power supply system mounted on an electric vehicle and a management device.

BACKGROUND ART

In recent years, hybrid vehicles (HVs), plug-in hybrid vehicles (PHVs), and electric vehicles (EVs) have become popular. These electric vehicles are equipped with a power supply system including a secondary battery as a key device.

In an electric vehicle, a method has been proposed in which output limit is performed at normal times in order to improve economic efficiency, and the output limit is relaxed when the output is insufficient such as during hill-climbing (see, for example, PTL 1).

CITATION LIST

Patent Literature

PTL 1: Unexamined Japanese Patent Publication No. 11-205914

SUMMARY OF THE INVENTION

As described above, it is effective to limit the output of the secondary battery in order to suppress the deterioration of the secondary battery mounted on the electric vehicle, but if the output limit value is too large, the electric vehicle may stop during hill-climbing. On the contrary, if the output limit value is too small, the effect of suppressing deterioration of the secondary battery becomes small.

The present invention has been made in view of such a situation, and an object of the present invention is to provide a technique for suppressing cell deterioration while ensuring travelling performance of an electric vehicle during hill-climbing.

In order to solve the above problems, a power supply system according to an embodiment of the present invention includes: a power storage unit in which a plurality of cells are connected; a voltage measuring unit that measures respective voltages of the plurality of cells; a current measuring unit that measures a current flowing through the plurality of cells; a temperature measuring unit that measures temperatures of the plurality of cells; and a controller of the power storage unit that determines an output limit value that defines an upper limit of a current or power recommended for suppressing cell deterioration, based on a voltage of each cell measured by the voltage measuring unit, a current measured by the current measuring unit, and temperatures measured by the temperature measuring unit, and notifies a host controller in the electric vehicle of the determined output limit value. The controller of the power storage unit is able to acquire, from the host controller, speed information, inclination information, and position information of the electric vehicle and information on a road on which the electric vehicle is traveling, and the controller of the power storage unit, when the electric vehicle climbs a hill, calculates a current value or power value to be discharged from the power storage unit, the current value or power value being required for the electric vehicle to climb the hill at a speed not less than a set minimum speed, while suppressing an amount of deterioration of the cell within an allowable range, and when the calculated current value or power value is larger than the output limit value, replaces the output limit value with the calculated current value or power value.

Any combination of the above components and a conversion of the expression of the present invention between methods, devices, systems and the like are also effective as aspects of the present invention.

According to the present invention, it is possible to suppress cell deterioration while ensuring the travelling performance of the electric vehicle during hill-climbing.

DESCRIPTION OF EMBODIMENT

Figure 1:
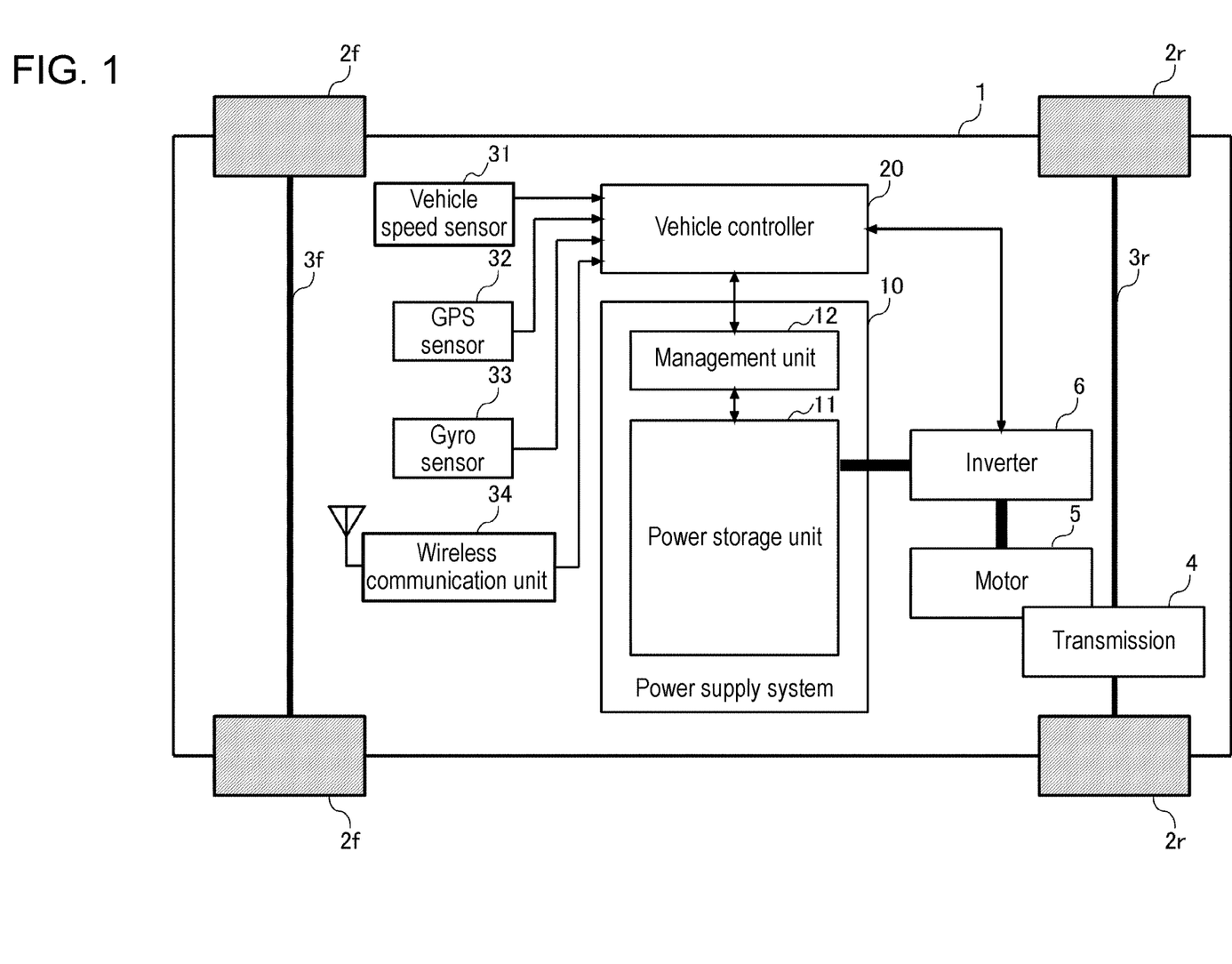
FIG. 1 is a diagram showing a schematic configuration of an electric vehicle according to an exemplary embodiment of the present invention.

FIG. 1 is a diagram showing a schematic configuration of electric vehicle 1 according to an exemplary embodiment of the present invention. Electric vehicle 1 shown in FIG. 1 is a rear-wheel drive (2WD) electric vehicle (EV) including a pair of front wheels 2f, a pair of rear wheels 2r, and motor 5 as a power source. The pair of front wheels 2f are connected by front wheel shaft 3f, and the pair of rear wheels 2r are connected by rear wheel shaft 3r. Transmission 4 transmits rotation of motor 5 to rear wheel shaft 3r at a predetermined conversion ratio.

Vehicle controller 20 is a vehicle electronic control unit (ECU) that controls entire electric vehicle 1, and may be configured by, for example, an integrated vehicle control module (VCM). Various detection information indicating a state of electric vehicle 1 is input to vehicle controller 20 from various sensors in electric vehicle 1. As various sensors, in FIG. 1, vehicle speed sensor 31, global positioning system (GPS) sensor 32, and gyro sensor 33 are provided.

Vehicle speed sensor 31 generates a pulse signal proportional to a rotation speed of front wheel shaft 3f or rear wheel shaft 3r, and transmits the generated pulse signal to vehicle controller 20. Vehicle controller 20 detects a speed of electric vehicle 1 based on the pulse signal received from vehicle speed sensor 31.

GPS sensor 32 detects position information of electric vehicle 1 and transmits the detected position information to vehicle controller 20. Specifically, GPS sensor 32 receives, from a plurality of GPS satellites, radio waves including their respective transmission times, and determines the latitude and longitude of the reception point based on the plurality of transmission times included in the plurality of received radio waves.

Gyro sensor 33 detects an angular velocity of electric vehicle 1 and transmits the detected angular velocity to vehicle controller 20. Vehicle controller 20 can detect an inclination angle of electric vehicle 1 by integrating the angular velocity received from gyro sensor 33.

Wireless communication unit 34 performs wireless communication with various servers on the Internet, roadside units, other vehicles, etc. As wireless communication networks, for example, a mobile phone network (cellular network), a wireless local area network (LAN), ETC (Electronic Toll Collection System), DSRC (Dedicated Short Range Communications), V2I (Vehicle-to-Infrastructure), V2V (Vehicle-to-Vehicle)) can be used.

In the present exemplary embodiment, vehicle controller 20 accesses a server that holds road information on the Internet via wireless communication unit 34, and acquires information on a road on which electric vehicle 1 is traveling. For example, in Japan, the digital road map database provided by the Japan Digital Road Map Association can be used.

When the digital road map data is stored on a recording medium in a car navigation system (not shown) in electric vehicle 1, vehicle controller 20 may acquire the road information from the car navigation system.

Figure 2:
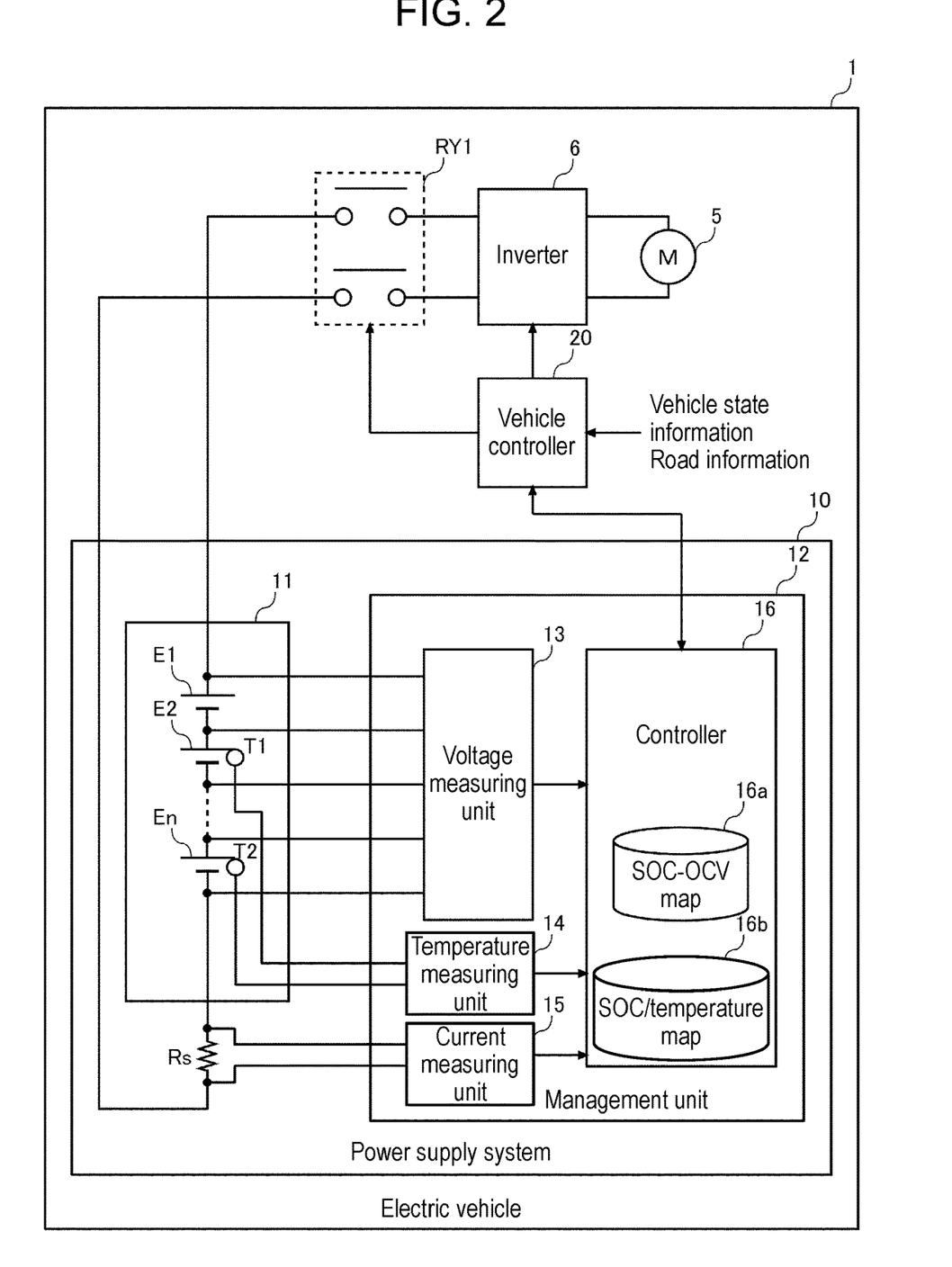
FIG. 2 is a diagram for explaining a detailed configuration of a power supply system for the electric vehicle shown in FIG. 1.

FIG. 2 is a diagram for explaining a detailed configuration of power supply system 10 of electric vehicle 1 shown in FIG. 1. Power supply system 10 is connected to motor 5 via relay RY1 and inverter 6. During power running, inverter 6 converts DC power supplied from power supply system 10 into AC power and supplied to motor 5. At the time of regeneration, the AC power supplied from motor 5 is converted into DC power and supplied to power supply system 10. Motor 5 is a three-phase AC motor, and rotates according to the AC power supplied from inverter 6 during power running. At the time of regeneration, the rotational energy due to deceleration is converted into AC power and supplied to inverter 6.

The relay RY1 is a contactor inserted between wirings connecting power supply system 10 and inverter 6. Vehicle controller 20 controls relay RY1 to an on state (closed state) during traveling, and electrically connects power supply system 10 and a power system of electric vehicle 1. When the vehicle is not running, vehicle controller 20 controls relay RY1 to an off state (open state) in principle, and electrically shuts off power supply system 10 and the power system of electric vehicle 1. Instead of the relay, another type of switch such as a semiconductor switch may be used.

Power supply system 10 includes power storage unit 11 and management unit 12, and power storage unit 11 includes a plurality of cells E1 to En connected in series. More specifically, power storage unit 11 includes one or a plurality of power storage modules. The plurality of power storage modules are connected in series or in series parallel. Each power storage module includes a plurality of cells connected in series or in series parallel. For the cell, a lithium ion battery cell, a nickel hydrogen battery cell, a lead battery cell, an electric double layer capacitor cell, a lithium ion capacitor cell, or the like can be used. Hereinafter, in the present specification, an example using a lithium ion battery cell (nominal voltage: 3.6 V to 3.7 V) is assumed. A number of cells E1 to En connected in series is determined according to a drive voltage of motor 5.

Shunt resistor Rs is connected in series with the plurality of cells E1 to En. Shunt resistor Rs functions as a current detection element. A Hall element may be used instead of shunt resistor Rs. Further, a plurality of temperature sensors T1 and T2 for detecting the temperatures of the plurality of cells E1 to En are installed in power storage unit 11. One temperature sensor may be installed in each power storage module, or one temperature sensor may be installed in each of a plurality of cells. For example, a thermistor can be used for temperature sensor T1, T2.

Management unit 12 includes voltage measuring unit 13, temperature measuring unit 14, current measuring unit 15, and controller 16. Each node of the plurality of cells E1 to En connected in series and voltage measuring unit 13 are connected by a plurality of voltage lines. Voltage measuring unit 13 measures the voltage of each cell E1 to En by measuring the voltage between two adjacent voltage lines. Voltage measuring unit 13 transmits the measured voltage of each cell E1 to En to controller 16.

Since voltage measuring unit 13 has a higher voltage than controller 16, voltage measuring unit 13 and controller 16 are connected by a communication line in an insulated state. Voltage measuring unit 13 can be configured by an application specific integrated circuit (ASIC) or a general-purpose analog front-end IC. Voltage measuring unit 13 includes a multiplexer and an A/D converter. The multiplexer outputs the voltage between two adjacent voltage lines to the A/D converter in order from the top. The A/D converter converts the analog voltage input from the multiplexer into a digital value.

Temperature measuring unit 14 includes a voltage dividing resistor and an A/D converter. The A/D converter sequentially converts a plurality of analog voltages respectively divided by a plurality of temperature sensors T1, T2 and a plurality of voltage dividing resistors into digital values and outputs them to controller 16. Controller 16 estimates the temperatures of the plurality of cells E1 to En based on the digital values. For example, controller 16 estimates the temperature of each cell E1 to En based on the value measured by the temperature sensor closest to each cell E1 to En.

Current measuring unit 15 includes a differential amplifier and an A/D converter. The differential amplifier amplifies the voltage across shunt resistor Rs and outputs it to the A/D converter. The A/D converter converts the voltage input from the differential amplifier into a digital value and outputs it to controller 16. Controller 16 estimates the current flowing through the plurality of cells E1 to En based on the digital value.

When an A/D converter is mounted in controller 16 and an analog input port is installed in controller 16, temperature measurement unit 14 and current measurement unit 15 may output the analog voltage to controller 16, and the A/D converter in controller 16 may convert it into a digital value.

Controller 16 manages the states of the plurality of cells E1 to En based on the voltages, temperatures, and currents of the plurality of cells E1 to En measured by voltage measuring unit 13, temperature measuring unit 14, and current measuring unit 15. Controller 16 and vehicle controller 20 are connected by an in-vehicle network. For example, a controller area network (CAN) or a local interconnect network (LIN) can be used as the in-vehicle network.

Controller 16 can be configured by a microcomputer and a non-volatile memory (for example, an electrically erasable programmable read-only memory (EEPROM), a flash memory). SOC (State Of Charge)-OCV (Open Circuit Voltage) map 16a and SOC/temperature map 16b are held in the non-volatile memory. SOC-OCV map 16a describes the characteristic data of the SOC-OCV curves of the plurality of cells E1 to En.

Controller 16 estimates the SOC and SOH (State Of Health) of each of the plurality of cells E1 to En. Controller 16 estimates the SOC by combining the OCV method and the current integration method. The OCV method is a method of estimating the SOC based on the OCV of each cell E1 to En measured by voltage measuring unit 13 and the characteristic data of the SOC-OCV curve described in SOC-OCV map 16a. The current integration method is a method of estimating the SOC based on the OCV at the start of charging or discharging of each cell E1 to En and the integrated value of the current measured by current measuring unit 15. In the current integration method, the measurement error of current measuring unit 15 is accumulated as the charging or discharging time becomes longer. Therefore, it is necessary to correct the SOC estimated by the current integration method using the SOC estimated by the OCV method.

The SOH is defined as the ratio of the current full charge capacity to the initial full charge capacity, and the lower the value (the closer to 0%), the more the deterioration progresses. The SOH may be obtained by measuring the capacity by complete charge and discharge, or may be obtained by adding the storage deterioration and the cycle deterioration. The storage deterioration can be estimated based on the SOC, temperature, and storage deterioration rate. The cycle deterioration can be estimated based on the SOC range used, temperature, current rate, and cycle deterioration rate. The storage deterioration rate and the cycle deterioration rate can be derived in advance by experiments or simulations. The SOC, temperature, SOC range, and current rate can be determined by measurement.

The SOH can also be estimated based on the correlation with the internal resistance of the cell. The internal resistance can be estimated by dividing the voltage drop generated when a predetermined current is made to flow through the cell for a predetermined time by the current value. The internal resistance has a relationship of decreasing as the temperature rises, and has a relationship of increasing as the SOH decreases.

SOC/temperature map 16b is a map that defines the relationship between the SOC and temperature of a cell and the output limit value. The output limit value is a value that defines an upper limit value of a current or power recommended for suppressing cell deterioration. The battery manufacturer determines the recommended output limit value for each various combination of the SOC and temperature of a cell based on numerical simulations and experiments in advance, and maps the relationship between them. The recommended output limit value is set to, for example, a current value or power value to prevent the deterioration from progressing faster than the average cell life curve. The recommended output limits are set separately for charging and discharging. SOC/temperature map 16b generated by the battery manufacturer is registered in the non-volatile memory in controller 16.

The relationship between the SOC and temperature of the cell and the recommended output limit value may be defined as a function. In that case as well, the derived function is registered in the non-volatile memory in controller 16.

SOC/temperature map 16b may be a map that defines the relationship between the SOC, temperature, and SOH of the cell, and the output limit value. The battery manufacturer determines the recommended output limit value for each various combination of the SOC, temperature, and SOH of the cell based on numerical simulations or experiments in advance, and maps the relationship between them. An internal resistance may be used instead of the SOH.

Controller 16 notifies vehicle controller 20 of the states of the plurality of cells E1 to En via the in-vehicle network. For example, controller 16 totals respective SOCs of the plurality of cells E1 to En to calculate the SOC of entire power storage unit 11, and notifies vehicle controller 20 of the calculated SOC of entire power storage unit 11. Further, controller 16 notifies vehicle controller 20 of the voltage applied to power storage unit 11 and the current flowing through power storage unit 11 in real time. Further, controller 16 notifies vehicle controller 20 of the above-mentioned output limit value.

Vehicle controller 20 sets the output limit value received from controller 16 of power supply system 10 in inverter 6. Inverter 6 controls the output current or output power within a range of the set output limit value. That is, the discharge current or discharge power from power storage unit 11 is controlled.

Figure 3:
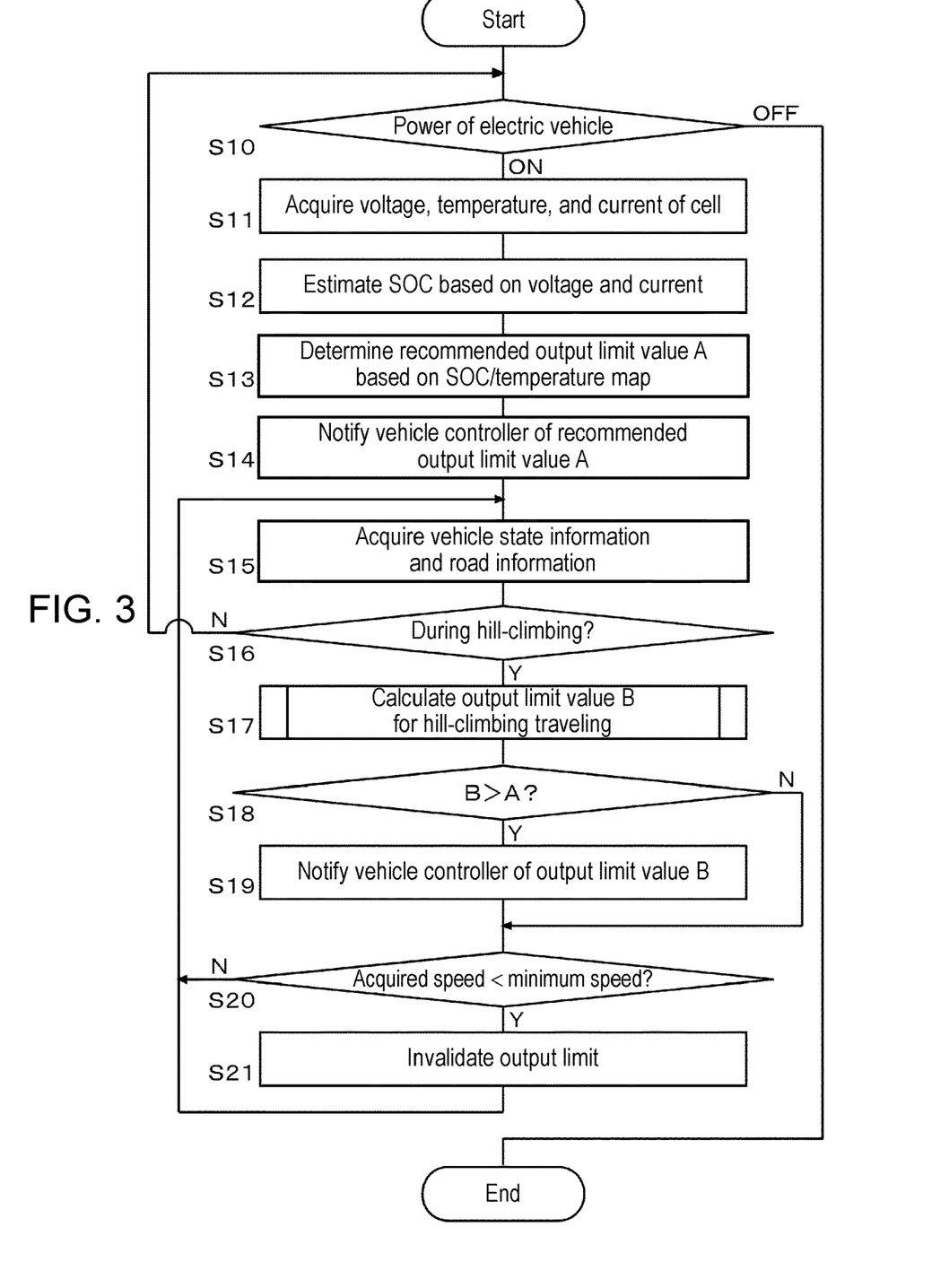
FIG. 3 is a flowchart showing a flow of processing related to output limit in the electric vehicle according to the exemplary embodiment of the present invention.

FIG. 3 is a flowchart showing a flow of processing related to output limit in electric vehicle 1 according to the exemplary embodiment of the present invention. When the power of electric vehicle 1 is turned on (corresponding to ignition on of an engine vehicle) (ON in step S10), controller 16 acquires the voltages, temperatures, and currents of the plurality of cells E1 to En measured by voltage measuring unit 13, temperature measuring unit 14, and current measuring unit 15 (S11). Controller 16 estimates the SOCs of the plurality of cells E1 to En based on the acquired voltages and currents (S12). Controller 16 determines recommended output limit value A of each cell with reference to SOC/temperature map 16b based on the estimated SOC of each cell and the temperature of each cell (S13). Controller 16 selects smallest output limit value A among determined recommended output limit values A of the respective cells, and notifies vehicle controller 20 of selected output limit value A (S14). This output limit value A is an output limit value for normal traveling.

Controller 16 acquires the state information of electric vehicle 1 via vehicle controller 20. Specifically, controller 16 acquires the speed information, the position information, and the inclination information of electric vehicle 1 as state information. Further, controller 16 acquires information on the road on which electric vehicle 1 is traveling (S15). The information on the road under traveling includes road type information, road minimum speed information, road position information, road altitude information, and the like.

Controller 16 determines whether or not electric vehicle 1 is climbing a hill (S16). For example, when the inclination angle of electric vehicle 1 acquired from vehicle controller 20 exceeds the set angle, controller 16 determines that the vehicle is climbing a hill. In addition, controller 16 may specify the position of the hill based on the acquired altitude transition of the road under traveling, and may collate it with the acquired position information of electric vehicle 1 to determine whether or not the vehicle is climbing a hill. In the latter case, it is possible to shift to a hill climbing mode immediately before the entrance of the hill. During hill climbing (Y in S16), controller 16 calculates output limit value B for hill climbing traveling (S17).

Figure 4:
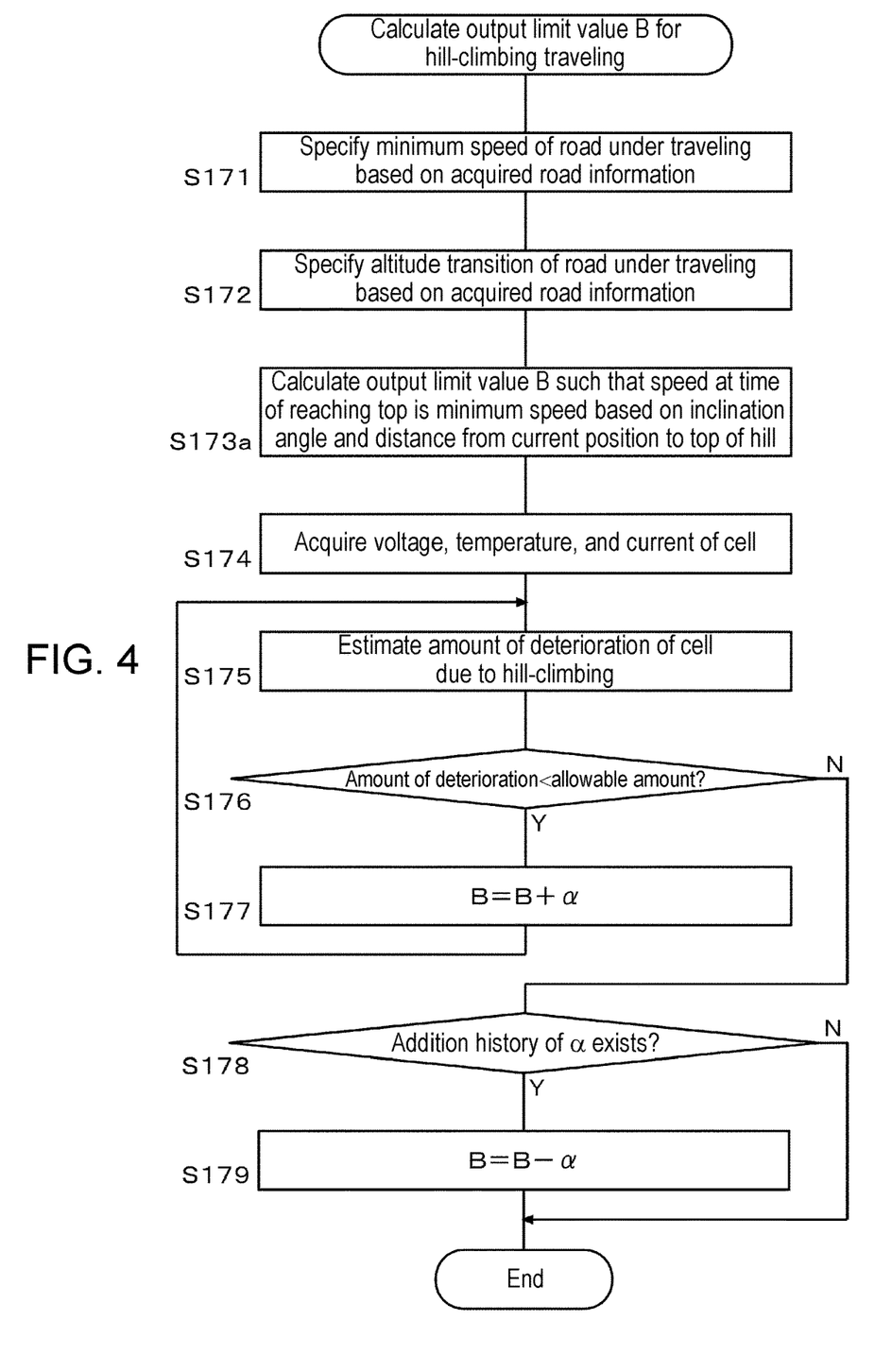
FIG. 4 is a flowchart showing a first example of a subroutine in step S17 of FIG. 3.

FIG. 4 is a flowchart showing a first example of a subroutine in step S17 of FIG. 3. Controller 16 specifies the minimum speed of the road on which electric vehicle 1 is traveling based on the acquired road information (S171). When the road under traveling is an expressway, the minimum speed is decided by law. In Japan, it is 50 km/h in principle. Even if the road under traveling is not an expressway, the minimum speed (for example, 30 km/h) may be specified by law depending on the section. When the minimum speed of the road under traveling is specified by law, controller 16 uses the minimum speed. When the minimum speed is not specified by law, controller 16 uses a speed preset by the manufacturer (for example, 30 km/h) as the minimum speed.

Controller 16 specifies the altitude transition of the hill based on the acquired road information (S172). Controller 16 calculates output limit value B such that the speed at the time of reaching the top is the minimum speed based on the inclination angle and the distance from the current position to the top of the hill (S173a).

For example, controller 16 calculates an average inclination angle or average gradient of the hill as an inclination angle from the current position to the top of the hill from the altitude transition of the hill. Controller 16 reverse calculates a speed at the current position required for electric vehicle 1 to climb the hill at a speed not less than the minimum speed, based on the deceleration function of electric vehicle 1 whose parameters are a target speed at the time of reaching the top (for example, 30 km/h), the average inclination angle or average gradient of the hill, and the distance from the current position to the top of the hill. This reverse-calculated speed at the current position is the speed at which the speed of electric vehicle 1 reaches the minimum speed at the top of the hill when electric vehicle 1 climbs the hill while a driver makes the accelerator opening constant. Controller 16 sets the output current or output power of inverter 6 corresponding to the reverse-calculated required speed at the current position to output limit value B.

Controller 16 acquires the voltages, temperatures, and currents of the plurality of cells E1 to En measured by voltage measuring unit 13, temperature measuring unit 14, and current measuring unit 15 (S174). Controller 16 estimates the amount of deterioration of the cell during the period when electric vehicle 1 climbs the hill based on the acquired voltage, temperature, and current (S175).

Controller 16 compares the estimated amount of deterioration of the cell with the allowable amount of cell deterioration (S176). The allowable amount is preset by the battery manufacturer. Specifically, it is set to an allowable maximum amount of deterioration by one hill-climbing, and the maximum amount of deterioration is set based on the battery model and the design concept of the battery manufacturer.

When the estimated amount of deterioration of the cell is smaller than the allowable amount (Y in S176), controller 16 adds a predetermined incremental value α to output limit value B (S177). The incremental value may be a fixed value or a variable value according to output limit value B. For example, the value obtained by multiplying output limit value B by a fixed rate (for example, 1%) may be an incremental value. Return to step S175. Controller 16 replaces the required speed at the current position of electric vehicle 1 or the speed corresponding to previous output limit value B with a speed corresponding to new output limit value B, and re-estimates the amount of deterioration of the cell for the period during which electric vehicle 1 climbs the hill (S175). Since the current rate increases from the previous estimation, the amount of deterioration of the cell increases.

In step S176, when the estimated amount of deterioration of the cell is greater than or equal to the allowable amount (N in S176), controller 16 determines whether or not there is a history of adding incremental value α to output limit value B (S178). When the history of adding incremental value α exists (Y in S178), controller 16 subtracts previously added incremental value α from output limit value B (S179). If the history of adding incremental value α does not exist (N in S178), the process in step S179 is skipped. The subroutine shown in FIG. 4 is terminated.

Figure 5:
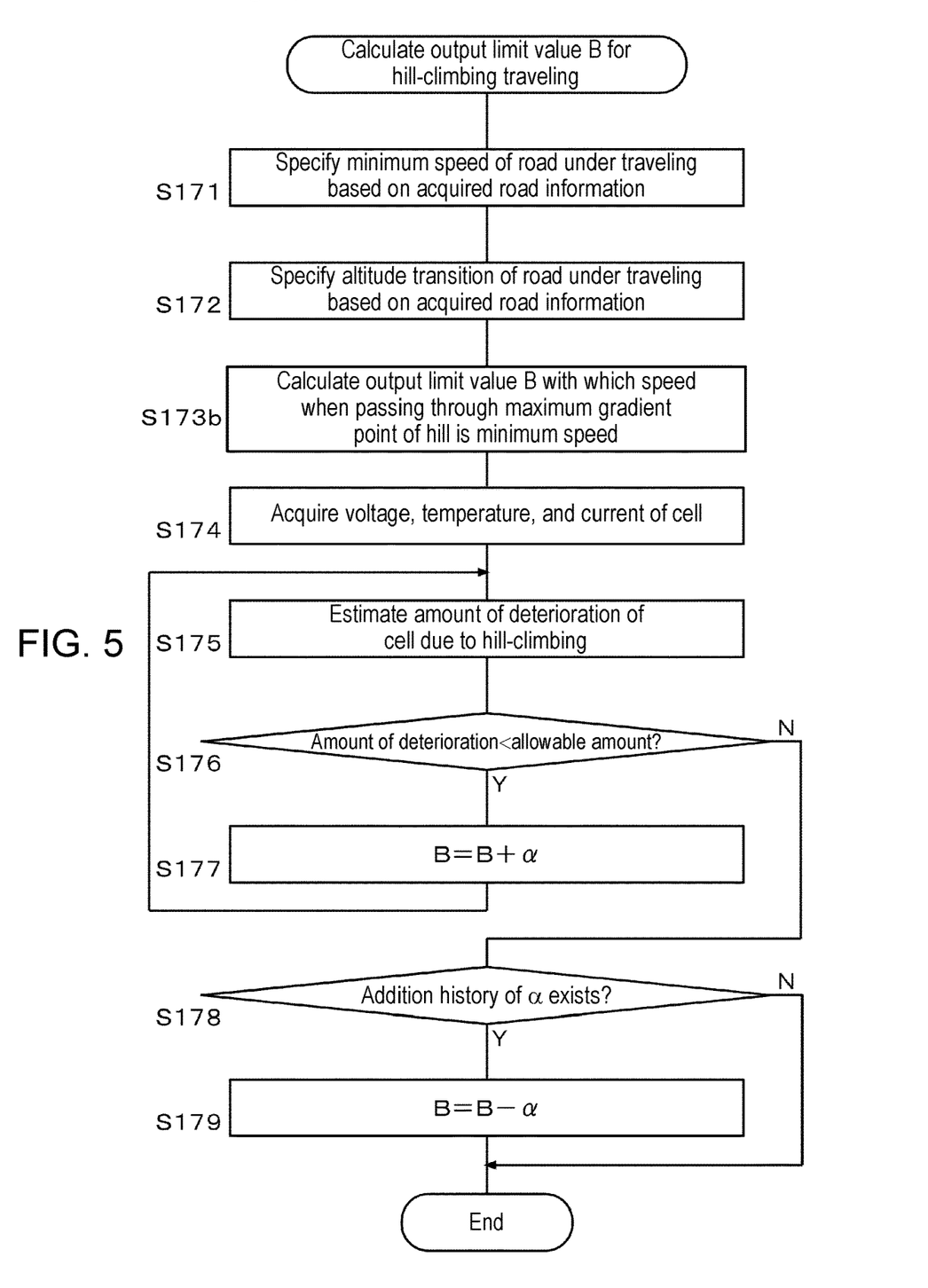
FIG. 5 is a flowchart showing a second example of the subroutine in step S17 of FIG. 3.

FIG. 5 is a flowchart showing a second example of the subroutine in step S17 of FIG. 3. Controller 16 specifies the minimum speed of the road on which electric vehicle 1 is traveling based on the acquired road information (S171). Controller 16 specifies the altitude transition of the hill based on the acquired road information (S172). Controller 16 calculates output limit value B at which the speed when passing through the maximum gradient point of the hill is the minimum speed (S173b). It is assumed that the accelerator opening is constant. For example, a map describing the relationship between the gradient and speed, and the output current or output power of inverter 6 is prepared in advance, and the output current or output power of inverter 6 corresponding to the combination of the maximum gradient and the minimum speed of the hill is derived. Controller 16 sets the derived output current or output power of inverter 6 to output limit value B.

Controller 16 acquires the voltages, temperatures, and currents of the plurality of cells E1 to En measured by voltage measuring unit 13, temperature measuring unit 14, and current measuring unit 15 (S174). Controller 16 estimates the amount of deterioration of the cell during the period when electric vehicle 1 climbs the hill based on the acquired voltage, temperature, and current (S175). Controller 16 compares the estimated amount of deterioration of the cell with the allowable amount of cell deterioration (S176).

When the estimated amount of deterioration of the cell is smaller than the allowable amount (Y in S176), controller 16 adds a predetermined incremental value α to output limit value B (S177). Return to step S175. Controller 16 replaces the above-described minimum speed of electric vehicle 1 or the speed corresponding to previous output limit value B with the speed corresponding to new output limit value B, and re-estimates the amount of deterioration of the cell during the period in which electric vehicle 1 climbs the hill (S175). Since the current rate increases from the previous estimation, the amount of deterioration of the cell increases.

In step S176, when the estimated amount of deterioration of the cell is greater than or equal to the allowable amount (N in S176), controller 16 determines whether or not there is a history of adding incremental value α to output limit value B (S178). When the history of adding incremental value α exists (Y in S178), controller 16 subtracts previously added incremental value α from output limit value B (S179). If the history of adding incremental value α does not exist (N in S178), the process in step S179 is skipped. The subroutine shown in FIG. 5 is terminated.

Return to FIG. 3. Controller 16 compares output limit value B for hill climbing traveling calculated in step S17 with output limit value A for normal traveling (S18). When output limit value B for hill climbing traveling is larger than output limit value A for normal traveling (Y in S18), controller 16 notifies vehicle controller 20 of output limit value B for hill climbing traveling (S19). When output limit value B for hill climbing traveling is less than or equal to output limit value A for normal traveling (N in S18), step S19 is skipped.

Controller 16 compares the speed of electric vehicle 1 acquired from vehicle controller 20 with the minimum speed (S20). When the speed of electric vehicle 1 is lower than the minimum speed (Y in S20), controller 16 notifies vehicle controller 20 of a signal instructing invalidation of the output limit (S21). The process transitions to step S15, and the processing of step S15 and subsequent steps is repeated. When the speed of electric vehicle 1 is higher than or equal to the minimum speed (N in S20), step S21 is skipped and the process proceeds to step S15.

In the case of the second example shown in FIG. 5, the calculation process of output limit value B for hill climbing traveling in step S17 may be executed once before or at the time of entering the hill. Also in the case of the first example shown in FIG. 4, it may be executed once before or at the time of entering the hill, but output limit value B may be calculated again in the middle of the hill.

In step S16, if the vehicle is not climbing (N in S16), the process proceeds to step S10. When the power of electric vehicle 1 is turned off (corresponding to the ignition off of the engine vehicle) (OFF in step S10), the entire process is terminated.

As described above, according to the present exemplary embodiment, it is possible to suppress the cell deterioration while ensuring the travelling performance of electric vehicle 1 during hill-climbing. In both the first example shown in FIG. 4 and the second example shown in FIG. 5, the output limit value is set so as to enable hill-climbing while the speed of electric vehicle 1 does not become lower than the minimum speed. That is, when output limit value B calculated so as to enable hill-climbing while the speed does not become lower than the minimum speed is larger than output limit value A for normal traveling, the output limit value is switched to output limit value B. By relaxing the output limit during hill-climbing in this way, it is possible to ensure the travelling performance of electric vehicle 1 during hill-climbing.

In addition, when the speed of electric vehicle 1 during hill-climbing becomes lower than the minimum speed due to deterioration of environmental conditions (head wind) or the like, output limit value B is canceled. As a result, the speed of electric vehicle 1 can be easily recovered, and an increase in the risk of a rear-end collision can be suppressed.

In addition, output limit value B is determined such that the amount of deterioration of the cell during hill-climbing falls within the allowable range. As a result, it is possible to suppress cell deterioration while ensuring the travelling performance of electric vehicle 1 during hill-climbing. Further, by setting output limit value B as loosely as possible while the amount of deterioration of the cell during hill-climbing is within the allowable range, it is possible to ensure the travelling performance of electric vehicle 1 during hill-climbing as large as possible.

The present invention has been described above based on the exemplary embodiment. It will be understood by those skilled in the art that the exemplary embodiment is merely an example, various modifications are available in each constituent element thereof or in a combination of each processing process, and such modifications still fall within the scope of the present invention.

The calculation method of output limit value B shown in FIGS. 4 and 5 is an example, and other calculation methods may be used. For example, in the first example shown in FIG. 4, the parameters of the deceleration function may further include the wind speed and/or the coefficient of friction of the road surface. Information on the wind speed and/or the coefficient of friction of the road surface can also be received from the outside via wireless communication unit 34. In this case, the required speed at the current position, which is the minimum speed at the top of the hill, can be reverse calculated more precisely.

Further, in the second example shown in FIG. 5, the map including the gradient and the speed as parameters may further include the wind speed and/or the coefficient of friction of the road surface as another parameter. In this case, the output current or output power of inverter 6 can be derived more precisely.

Further, in FIGS. 4 and 5 above, the processing of steps S174 to S179 may be omitted. In this case, output limit value B becomes a stricter value, and the cell deterioration can be further suppressed. The speed during hill-climbing will be more limited, but it is possible to climb the hill at a speed not less than the minimum speed.

In the above-described exemplary embodiment, a pure electric vehicle (EV) without an engine is assumed as electric vehicle 1, but even in the case of a hybrid vehicle (HV) or a plug-in hybrid vehicle (PHV), the present invention can be applied to hill-climbing by motor traveling.

The exemplary embodiment may be specified by the following items.

Item 1

Power supply system (10) mounted on electric vehicle (1), including:
- power storage unit (11) in which a plurality of cells (E1 to En) are connected;
- voltage measuring unit (13) that measures respective voltages of the plurality of cells (E1 to En);
- current measuring unit (15) that measures a current flowing through the plurality of cells (E1 to En);
- temperature measuring unit (14) that measures temperatures of the plurality of cells (E1 to En); and
- controller (16) of power storage unit (11) that determines an output limit value that defines an upper limit of a current or power recommended for suppressing cell deterioration, based on a voltage of each of the plurality of cells (E1 to En) measured by voltage measuring unit (13), a current measured by current measuring unit (15), and temperatures measured by temperature measuring unit (14), and notifies host controller (20) in electric vehicle (1) of the determined output limit value, in which
- controller (16) of power storage unit (11) is able to acquire, from host controller (20), speed information, inclination information, and position information of electric vehicle (1) and information on a road on which electric vehicle (1) is traveling, and
- controller (16) of power storage unit (11), when electric vehicle (1) climbs a hill, calculates a current value or power value to be discharged from power storage unit (11), the current value or power value being required for electric vehicle (1) to climb the hill at a speed not less than a set minimum speed, while suppressing an amount of deterioration of the plurality of cells (E1 to En) within an allowable range, and when the calculated current value or power value is larger than the output limit value, replaces the output limit value with the calculated current value or power value.

According to this, it is possible to suppress the deterioration of cell (E1 to En) while ensuring the travelling performance of electric vehicle (1) during hill-climbing.

Item 2

Power supply system (10) according to item 1, in which controller (16) of power storage unit (11) calculates a current value or power value to be discharged from power storage unit (11) in such a manner that a speed of electric vehicle (1) is the minimum speed at the time of reaching a top of the hill, based on an inclination angle and a distance from a current position to the top of the hill.

According to this, electric vehicle (1) can climb the hill while suppressing deterioration of cells (E1 to En) at a speed not less than the minimum speed.

Item 3

Power supply system (10) according to item 1, in which controller (16) of power storage unit (11) calculates a current value or power value to be discharged from power storage unit (11) in such a manner that a speed when electric vehicle (1) passes through a maximum gradient point of the hill is the minimum speed.

According to this, electric vehicle (1) can climb the hill while suppressing deterioration of cells (E1 to En) at a speed not less than the minimum speed.

Item 4

Power supply system (10) according to item 2 or 3, in which controller (16) of power storage unit (11) adds a predetermined incremental value to the calculated current value or power value to be discharged from power storage unit (11) within the allowable range of the amount of deterioration of cells (E1 to En).

According to this, the travelling performance of electric vehicle (1) can be ensured as much as possible within the allowable range of the amount of deterioration of cells (E1 to En).

Item 5

Power supply system (10) according to any one of items 1 to 4, in which controller (16) of power storage unit (11) cancels the output limit when electric vehicle (1) climbs the hill and the speed of electric vehicle (1) is less than the minimum speed.

According to this, the minimum travelling performance of electric vehicle (1) during hill-climbing can be guaranteed.

Item 6

Management device (12) included in power supply system (10) mounted on electric vehicle (1), management device (12) including:
  voltage measuring unit (13) that measures respective voltages of a plurality of cells (E1 to En) in power storage unit (11) included in power supply system (10);
  current measuring unit (15) that measures a current flowing through the plurality of cells (E1 to En);
  temperature measuring unit (14) that measures temperatures of the plurality of cells (E1 to En); and
  controller (16) of power storage unit (11) that determines an output limit value that defines an upper limit of a current or power recommended for suppressing cell deterioration, based on a voltage of each of the plurality of cells (E1 to En) measured by voltage measuring unit (13), a current measured by current measuring unit (15), and temperatures measured by temperature measuring unit (14), and notifies host controller (20) in electric vehicle (1) of the determined output limit value, in which
  controller (16) of power storage unit (11) is able to acquire, from host controller (20), speed information, inclination information, and position information of electric vehicle (1) and information on a road on which electric vehicle (1) is traveling, and
  controller (16) of power storage unit (11), when electric vehicle (1) climbs a hill, calculates a current value or power value to be discharged from power storage unit (11), the current value or power value being required for electric vehicle (1) to climb the hill at a speed not less than a set minimum speed, while suppressing an amount of deterioration of cells (E1 to En) within an allowable range, and when the calculated current value or power value is larger than the output limit value, replaces the output limit value with the calculated current value or power value.

According to this, it is possible to suppress the deterioration of cell (E1 to En) while ensuring the travelling performance of electric vehicle (1) during hill-climbing.

REFERENCE MARKS IN THE DRAWINGS 1 electric vehicle
2f front wheel
2r rear wheel
3f front wheel shaft
3r rear wheel shaft
4 transmission
5 motor
6 inverter
10 power supply system
11 power storage unit
12 management unit
13 voltage measuring unit
14 temperature measuring unit
15 current measuring unit
16 controller
16a SOC-OCV map
16b SOC/temperature map
E1-En cell
Rs shunt resistance
T1, T2 temperature sensor
20 vehicle controller
31 vehicle speed sensor
32 GPS sensor
33 Gyro sensor
34 wireless communication unit
RY1 relay

The invention claimed is:
1. A power supply system mounted on an electric vehicle, the power supply system comprising:
  a power storage unit including a plurality of cells connected to each other;
  a voltage measuring unit that measures voltage of each of the plurality of cells;
  a current measuring unit that measures a current flowing through the plurality of cells;
  a temperature measuring unit that measures temperatures of the plurality of cells; and
  a controller of the power storage unit, wherein:
  the controller is configured to:
    determine an output limit value that defines an upper limit of a current or power recommended for suppressing cell deterioration, based on the voltage of the each of the plurality of cells measured by the voltage measuring unit, the current measured by the current measuring unit, and the temperatures measured by the temperature measuring unit, acquire, from a host controller in the electric vehicle, speed information, inclination information, and position information of the electric vehicle and information on a road on which the electric vehicle is traveling, determine whether the electric vehicle climbs a hill or not, when it is determined the electric vehicle climbs a hill, calculate a current value or power value to be discharged from the power storage unit, the current value or power value being required for the electric vehicle to climb the hill at a speed not less than a minimum speed which is preset, while suppressing an amount of deterioration of the each of the plurality of cells within an allowable range, and when the calculated current value or power value is larger than the output limit value, replaces the output limit value with the calculated current value or power value as a new output limit value.

2. The power supply system according to claim 1, wherein the controller of the power storage unit calculates the current value or power value to be discharged from the power storage unit in such a manner that a speed of the electric vehicle is the minimum speed at a time of reaching a top of the hill, based on an inclination angle and a distance from a current position to the top of the hill.

3. The power supply system according to claim 1, wherein the controller of the power storage unit calculates the current value or power value to be discharged from the power storage unit in such a manner that a speed when the electric vehicle passes through a maximum gradient point of the hill is the minimum speed.

4. The power supply system according to claim 2, wherein the controller of the power storage unit adds a predetermined incremental value to the calculated current value or power value to be discharged from the power storage unit within the allowable range of the amount of deterioration of the cell.

5. The power supply system according to claim 1, wherein the controller of the power storage unit cancels the new output limit value when the electric vehicle climbs the hill and the speed of the electric vehicle is less than the minimum speed.

6. A management device included in a power supply system mounted on an electric vehicle, the management device comprising:

a voltage measuring unit that measures voltage of each of a plurality of cells in a power storage unit included in the power supply system;

a current measuring unit that measures a current flowing through the plurality of cells;

a temperature measuring unit that measures temperatures of the plurality of cells; and a controller of the power storage unit configured to:
 determine an output limit value that defines an upper limit of a current or power recommended for suppressing cell deterioration, based on the voltage of each of the plurality of cells measured by the voltage measuring unit, a current measured by the current measuring unit, and temperatures measured by the temperature measuring unit,
 acquire, from a host controller in the electric vehicle, speed information, inclination information, and position information of the electric vehicle and information on a road on which the electric vehicle is traveling,
 determine whether the electric vehicle climbs a hill or not,
 when it is determined that the electric vehicle climbs a hill, calculate a current value or power value to be discharged from the power storage unit, the current value or power value being required for the electric vehicle to climb the hill at a speed not less than a minimum speed which is preset, while suppressing an amount of deterioration of the each of the plurality of cells within an allowable range, and
 when the calculated current value or power value is larger than the output limit value, replace the output limit value with the calculated current value or power value as a new output limit value.

7. The power supply system according to claim 1, wherein the controller of the power storage unit notifies a host controller in the electric vehicle of the output limit value determined.

8. The management device according to claim 6, wherein the controller of the power storage unit notifies a host controller in the electric vehicle of the output limit value determined.

9. A management device included in a power supply system mounted on an electric vehicle including a power storage unit including a plurality of cells, comprising:

a controller configured to:
 determine an output limit value that defines an upper limit of a current or power recommended for suppressing cell deterioration, based on a voltage of each of the plurality of cells, a current flowing through the plurality of cells, and a temperature of each of the plurality of cells,
 notifies a host controller in the electric vehicle of the output limit value determined,
 acquire, from the host controller in the electric vehicle, information relating to the electric vehicle and information on a road on which the electric vehicle is traveling,
 when the electric vehicle climbs a hill, calculate a current value or power value to be discharged from the power storage unit, the current value or power value being required for the electric vehicle to climb the hill at a speed not less than a minimum speed which is preset, while suppressing an amount of deterioration of the each of the plurality of cells within an allowable range, and
 when the calculated current value or power value is larger than the output limit value, notifies the host controller in the electric vehicle of the calculated output limit value as a new output limit value.

10. The power supply system according to claim 1, wherein the minimum speed is acquired from the host controller.

11. The management device according to claim 6, wherein the minimum speed is acquired from the host controller.

12. The management device according to claim 9, wherein the minimum speed is acquired from the host controller.

13. The power supply system according to claim 1, wherein the minimum speed is specified by a law with respect to the hill.

14. The management device according to claim 6, wherein the minimum speed is specified by a law with respect to the hill.

15. The management device according to claim 9, wherein the minimum speed is specified by a law with respect to the hill.

16. The power supply system according to claim 1, wherein the minimum speed is preset by a manufacture of the electric vehicle.

17. The management device according to claim 6, wherein the minimum speed is preset by a manufacture of the electric vehicle.

18. The management device according to claim 9, wherein the minimum speed is preset by a manufacture of the electric vehicle.

* * * * *